US012628306B2

(12) United States Patent
Yu et al.

(10) Patent No.: US 12,628,306 B2
(45) Date of Patent: May 12, 2026

(54) DOUBLE UNLOCKING MECHANISM FOR SLIDE RAILS

(71) Applicant: Asia Pacific CIS Wuxi Co., Ltd., Wuxi (CN)

(72) Inventors: Qi Yu, Wuxi (CN); Sheng Pang, Wuxi (CN)

(73) Assignee: Asia Pacific CIS (Wuxi) Co. Ltd., Wuxi (CN)

( * ) Notice: Subject to any disclaimer, the term of this patent is extended or adjusted under 35 U.S.C. 154(b) by 270 days.

(21) Appl. No.: 18/472,937

(22) Filed: Sep. 22, 2023

(65) Prior Publication Data

US 2024/0114643 A1 Apr. 4, 2024

(30) Foreign Application Priority Data

Sep. 22, 2022 (CN) .......................... 202211160304.5

(51) Int. Cl.
| | |
|---|---|
| *H05K 7/14* | (2006.01) |
| *A47B 88/403* | (2017.01) |
| *A47B 88/49* | (2017.01) |
| *A47B 88/493* | (2017.01) |
| *A47B 88/57* | (2017.01) |
| *A47B 88/423* | (2017.01) |

(52) U.S. Cl.
CPC ......... *H05K 7/1489* (2013.01); *A47B 88/403* (2017.01); *A47B 88/49* (2017.01); *A47B 88/493* (2017.01); *A47B 88/57* (2017.01); *A47B 2088/4235* (2017.01); *A47B 2210/0018* (2013.01); *A47B 2210/0081* (2013.01)

(58) Field of Classification Search
CPC .... H05K 7/1489; A47B 88/49; A47B 88/493; A47B 88/57; A47B 88/483; A47B 88/487; A47B 88/477; A47B 2088/4235; A47B 2210/0081; A47B 2210/0018
See application file for complete search history.

(56) References Cited

U.S. PATENT DOCUMENTS

| | | | |
|---|---|---|---|
| 4,473,262 A | 9/1984 | Staye | |
| 4,549,773 A | 10/1985 | Papp et al. | |
| 4,560,212 A | 12/1985 | Papp et al. | |
| 5,169,238 A | 12/1992 | Schenk | |
| 5,255,983 A | 10/1993 | Parvin | |
| 6,126,255 A | 10/2000 | Yang | |
| 6,935,710 B2 * | 8/2005 | Chen .................... | A47B 88/487 312/334.44 |
| 7,404,611 B1 * | 7/2008 | Que .................... | A47B 88/493 312/334.46 |

(Continued)

FOREIGN PATENT DOCUMENTS

| | | |
|---|---|---|
| CN | 107387557 A | 11/2017 |
| CN | 209017384 U | 6/2019 |

(Continued)

*Primary Examiner* — Kimberley S Wright
(74) *Attorney, Agent, or Firm* — Quarles & Brady LLP

(57) ABSTRACT

A server slide can include a first rail and a second rail configured to slidably receive the first rail. In one example, a first pull rod for a locking mechanism can be slidably mounted to the first rail. A second pull rod for the locking mechanism can be slidably mounted to the first rail. The first and second pull rods can be mechanically connected such that actuation of the first pull rod simultaneously actuates the second pull rod to operate the locking mechanism.

19 Claims, 6 Drawing Sheets

(56) References Cited

U.S. PATENT DOCUMENTS

| | | | |
|---|---|---|---|
| 7,481,504 | B2 | 1/2009 | Chen et al. |
| 7,571,968 | B2 * | 8/2009 | Ji ........................ A47B 88/493 |
| | | | 312/334.44 |
| 7,658,457 | B2 | 2/2010 | Lu |
| 7,726,755 | B2 * | 6/2010 | Peng ...................... A47B 88/57 |
| | | | 312/334.46 |
| 7,780,252 | B2 | 8/2010 | Mushan et al. |
| 8,303,052 | B2 | 11/2012 | Chen et al. |
| 8,500,223 | B2 | 8/2013 | Lacarra |
| 9,211,003 | B1 | 12/2015 | Chen et al. |
| 9,279,280 | B1 | 3/2016 | Chen et al. |
| 9,538,845 | B1 | 1/2017 | Chen |
| 9,629,459 | B2 | 4/2017 | Chen et al. |
| 9,670,956 | B2 * | 6/2017 | Judge ....................... F16C 29/04 |
| 9,675,175 | B1 | 6/2017 | Chen et al. |
| 9,848,701 | B1 * | 12/2017 | Chen ...................... A47B 88/57 |
| 9,980,565 | B2 | 5/2018 | Chen et al. |
| 10,041,535 | B2 | 8/2018 | Chen et al. |
| 10,111,357 | B2 | 10/2018 | Chen |
| 10,244,868 | B2 | 4/2019 | Chen et al. |
| 10,334,950 | B2 | 7/2019 | Chen et al. |
| 10,631,639 | B2 | 4/2020 | Chen et al. |
| 10,646,038 | B2 | 5/2020 | Chen et al. |
| 10,806,255 | B1 | 10/2020 | Chen et al. |
| 11,134,776 | B2 | 10/2021 | Chen et al. |
| 11,246,410 | B2 | 2/2022 | Chen et al. |
| 11,266,239 | B1 | 3/2022 | Chen et al. |
| 11,445,824 | B2 | 9/2022 | Chen et al. |
| 11,486,442 | B2 | 11/2022 | Chen et al. |
| 11,641,939 | B2 | 5/2023 | Chen et al. |
| 11,641,940 | B2 | 5/2023 | Chen et al. |
| 2004/0174100 | A1 * | 9/2004 | Chen ...................... A47B 88/50 |
| | | | 312/333 |
| 2005/0248247 | A1 | 11/2005 | Huang |
| 2008/0111457 | A1 * | 5/2008 | Ji ......................... A47B 88/493 |
| | | | 312/334.44 |
| 2013/0259410 | A1 * | 10/2013 | Judge ...................... F16C 29/04 |
| | | | 384/49 |
| 2016/0262538 | A1 | 9/2016 | Chen et al. |
| 2020/0214444 | A1 * | 7/2020 | Chen ...................... A47B 88/473 |
| 2021/0145174 | A1 | 5/2021 | Chen et al. |
| 2022/0065292 | A1 | 3/2022 | Chen et al. |
| 2023/0157451 | A1 | 5/2023 | Flagin et al. |

FOREIGN PATENT DOCUMENTS

| | | | | |
|---|---|---|---|---|
| CN | 112543574 A | * | 3/2021 | ............... H05K 7/18 |
| CN | 115515364 A | | 12/2022 | |
| EP | 2144530 B1 | | 6/2017 | |
| EP | 3307038 B1 | | 11/2021 | |

* cited by examiner

DOUBLE UNLOCKING MECHANISM FOR SLIDE RAILS

CROSS-REFERENCE TO RELATED APPLICATIONS

This application is based on and claims the benefit of priority from Chinese Patent Application No. 202211160304.5, filed on Sep. 22, 2022, which is hereby incorporated by reference.

BACKGROUND

Servers are usually installed in server cabinets including one or more slide rails to facilitate telescopic movement (e.g., expansion or contraction) of the server in relation to the server cabinet. For example, slide rails may be extended for repair, maintenance, or other operations for a supported server.

SUMMARY

Some embodiments of the invention provide a server rail assembly configured to mitigate the risk of accidental removal of a server from a server rack. The server slide can include a first rail and a second rail configured to slidably receive the first rail. In one example, a first pull rod having a first slot of a first length is slidably mounted to the first rail via a fastener arranged through the first slot. Correspondingly, a second pull rod having one or more second slots each of a second length is slidably mounted to the first rail via a fastener arranged through each of the second slots. In one example, the second length of the second slots of the second pull rod is greater than the first length of the first slot of the first pull rod. In another example, the first and second pull rods are mechanically connected such that actuation of the first pull rod simultaneously actuates the second pull rod.

Some embodiments of the invention provide a server slide having a first rail and a second rail that slidably receives the first rail. The server slide may further include a first pull rod and a second pull rod each slidably mounted to the first rail. In one example, a first locking pawl and a second locking pawl are rotatably supported on the first rail to engage a locking block extending from the second rail. In one example, the first and second pull rods are mechanically connected such that actuation of the first pull rod simultaneously actuates the second pull rod. In another example, actuation of the first pull rod rotates the first locking pawl to permit unidirectional movement of the first rail relative to the second rail. Correspondingly, actuation of the second pull rod rotates both the first and second locking pawls to permit bidirectional movement of the first rail relative to the second rail.

Some embodiments of the invention provide a method of actuating a server slide. In one example, the method includes actuating both a first pull rod and a second pull rod via a first handle defined by the first pull rod. The method further includes, rotating a first locking pawl of the server slide via contact with a first arcuate portion of the second pull rod, permitting slidable movement of the first rail relative to a second rail in a first direction. In another example, the method includes actuating the second pull rod via a second handle defined by the second pull rod, rotating both the first locking pawl and a second locking pawl via contact with respective first and second arcuate portions of the second pull rod, and permitting slidable movement of the first rail in both a first direction and a second, opposite, direction.

In one example, a slide rail assembly may include a double unlocking mechanism having a first rail and a second rail, which can slide relative to each other along a longitudinal direction. The slide rail assembly may further include a slide latch assembly mounted between the first rail and the second rail. In one example, the slide latch assembly may include a first pull rod and a second pull rod linkable with the first pull rod. The first and second pull rods may be slidably mounted to the first rail via one or more fasteners (e.g., rivets). The slide latch assembly may further include a first rotatable locking pawl and a second rotatable locking pawl, which may be selectively rotated via the actuation of the second pull rod. To facilitate locking of the second slide rail assembly, a locking block extends away from the second rail towards the first rail. The locking block is configured to engage the first and second locking pawls to prevent actuation of the slide rail assembly.

In another example, the first pull rod includes a first slide slot and a first handle arranged along a longitudinal direction. The first pull rod may be slidably mounted to an inner side of the first rail via one or more fasteners (e.g., rivets) arranged through the first slide slot.

Correspondingly, the second pull rod includes one or more second slide slots and a second handle arranged along a longitudinal direction. The second pull rod may be slidably mounted to the inner side of the first rail via one or more fasteners (e.g., rivets) arranged through each of the second slide slots. In one example, the first pull rod and the second pull rod are connected via a fastener (e.g., rivet) arranged through a connection slot of the second pull rod.

In one example, the first locking pawl and the second locking pawl are rotatably mounted to the inner side of the first rail via one or more fasteners (e.g., rivets).

In another example, a biasing element is provided between the second pull rod and the first rail, with one end of the biasing element connected to the second pull rod via a snap-fit and a second, opposite, end of the biasing element connected to the first rail via a snap-fit.

In another example, the first slide slot has a length that is shorter (i.e., dimensionally smaller) than a corresponding length of the second slide slots and the connection slot.

In another example, the second pull rod includes a first arcuate portion and a second arcuate portion that respectively contact the first locking pawl and the second locking pawl to generate rotation in the first or second locking pawls when the second pull rod is actuated.

In another example, the locking block is positioned between the first locking pawl and the second locking pawl when the slide rail assembly is in the open position (e.g., the first rail is extended outward from the second rail). Correspondingly, the locking block is located at the end portion of the first rail when the slide rail assembly is in the closed portion (e.g., the first rail is contracted into the second rail).

In another example, a tongue extends away from a surface of the first rail towards the second rail. Correspondingly, the second rail includes a groove configured to receive the tongue when the slide rail assembly is closed.

In another example, a plurality of guide tabs extend from the inside of the first rail towards the second rail to maintain the position of the second pull rod.

In another example, a protrusion extends from the first pull rod to restrict movement of the second pull rod. For example, the protrusion is configured contact an end of the second pull rod.

In another example, the first rail includes one or more elongated openings corresponding to the position of the first handle and the second handle to permit an operator to actuate the first or second pull rods via the first or second handles. In one particular example, the elongated openings define a length greater than those of both the first handle and the second handle.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
FIG. 1 is a perspective view of one example of a slide rail according to examples of the present invention.
Figure 2:
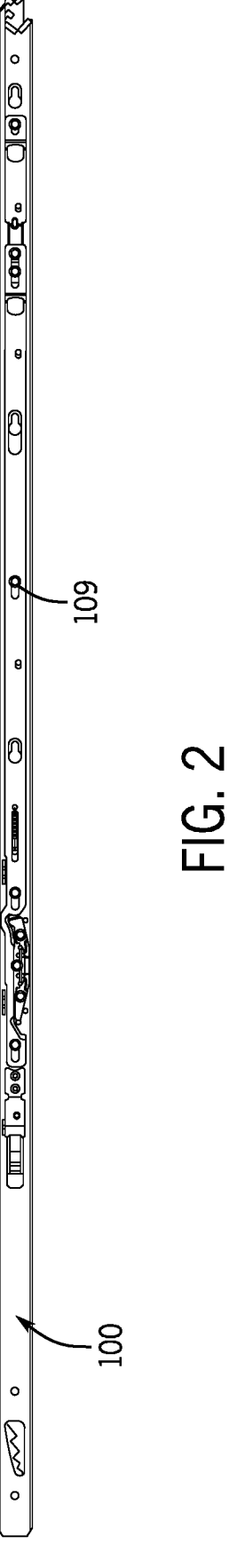
FIG. 2 is a side view of the slide rail of FIG. 1.

The following discussion is presented to enable a person skilled in the art to make and use embodiments of the invention. Given the benefit of this disclosure, various modifications to the illustrated embodiments will be readily apparent to those skilled in the art, and the principles herein can be applied to other embodiments and applications without departing from embodiments of the invention. Thus, embodiments of the invention are not intended to be limited to embodiments shown, but are to be accorded the widest scope consistent with the principles and features disclosed herein.

The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Some server slide rails are equipped with self-locking mechanisms to lock the slide rail into the open or closed position, thereby preventing derailment of the slide rails. When movement of a slide rail needs to be unlocked (e.g., to move the slide rail from an extended position to a contracted position, or vice versa), a pull rod of an unlocking mechanism may be pulled. This action can cause a push plate of the pull rod to contact the slide rail, at which time the slide rail can be adjusted (e.g., contracted by telescoping inwards, towards the server cabinet). Nevertheless, this type of unlocking mechanism may carry certain risks. For example, in conventional designs the slide rail may be completely free (e.g., able to be removed from server cabinet) when the pull rod is pulled, and the push plate correspondingly raised. Thus, there is a risk that the slide rail may be pulled out together with the server during telescopic adjustment of the server/slide rail, which can cause inadvertent damage to the server or otherwise increase downtime for the relevant system.

The present invention relates to a slide rail assembly and, more particularly, to a double unlocking mechanism for slide rail assembly that can address the issue noted above (or others). In some examples, the double unlocking mechanism includes a slide latch assembly positioned between a first rail and a second rail, and the slide latch assembly can include: a first pull rod and a second pull rod adjustably connected to the first pull rod, a first locking pawl and a second locking pawl, and a locking block extending from the second rail. (As used herein, "rod" refers generally to an elongate body that can transfer mechanical force via pushing or pulling (e.g., via rigid translation of the rod). In this regard, various "rods" may exhibit a variety of cross-sectional (and other) geometry, and may not necessarily be circular in cross-section.)

In one example, the slide latch assembly may operate in two distinct modes, with different actuation of a locking pawls depending on the mode of engagement with the relevant pull rods. For example, when closing an expanded slide rail assembly, a user may actuate the second pull rod via the first pull rod (e.g., via a first handle) to only rotate the first locking pawl (and not the second locking pawl). Thus, only unidirectional movement of the first slide rail may be permitted (e.g., only inward/contraction of first slide rail). In another example, when removing the first rail from the slide rail assembly, a user may actuate the second pull rod (e.g., via a second handle) to rotate both the first and second locking pawls. Thus, bidirectional movement of the first slide rail may be permitted (e.g., inward/contraction and outward/expansion of the first rail).

In some examples, to facilitate this two-mode operation, the first and second pull rods are each secured to the first slide rail via one or more respective fasteners (e.g., rivets) arranged through one or more respective slots. In particular, the first pull rod can include a first slot that has an overall smaller (e.g., dimensionally shorter) length as compared to one or more second slots arranged along the second pull rod. Thus, as the fasteners slide within the slots (e.g., during actuation of the first or second pull rods) actuation of the first pull rod is limited as compared to actuation of the second pull rod. In that way, actuating the second pull rod via the first pull rod (e.g., via the first handle) can limit the overall actuation distance of the second pull rod and thereby result in unlocking only of a unidirectional movement of the first slide rail. Correspondingly, actuating the second pull rod directly (e.g., via the second handle of the second pull rod) can result in a larger overall actuation distance of the second pull rod (when compared to actuation via the first handle) and thereby unlock bidirectional movement of the first slide rail.

As shown in FIG. 1, a slide rail assembly 95 may include a first rail 100 and a second rail 90. In one example, the first rail 100 may nest within the second rail 90, such that the first rail 100 may telescope into or out of the second rail 90. In one example, the first rail 100 may be slidingly connected to the second rail 90 by a ball bearing retaining rack 130, which may move along with the first rail 100.

In one example, the slide rail assembly 95 of the present invention may include a variable number of rails (e.g., first rail, second rail, third rail, etc.) depending on a desired overall length or use case of the slide rail assembly 95. In one example, each of the rails (e.g., first rail, second rail, third rail, etc.) may be slidingly connected to each other along a longitudinal direction. In another example, a slide latch assembly 200 is arranged between every two adjacent sections of the slide rail (e.g., between the first rail and second rail).

As shown in FIGS. 2-5, the slide latch assembly 200 includes a first pull rod 201 and a second pull rod 202 mounted to the first rail 100. The pull rods 201, 202 may be slidably mounted to the first rail 100 via one or more fasteners (e.g., bolts, nuts, screws, adhesives, rivets, etc.). In one example, the first pull rod 201 may be mechanically linked to the second pull rod 202 via a fastener (e.g., rivet) arranged through a connection slot 108.

The slide latch assembly 200 may further include a first locking pawl 103 and a second locking pawl 104, which may be selectively actuated by the pull rods 201, 202. In one example, the first and second locking pawls 103, 104 may be maintained in a locked position via a biasing element 105 (e.g., a spring or other elastic material). For example, the first and second locking pawls 103, 104 may engage a locking block 118 extending from the second rail 90 towards the first rail 100 to prevent telescopic movement of the first rail 100. In one example, the first locking pawl 103 and the second locking pawl 104 are rotatably mounted to an inside surface of the first rail 100 via one or more fasteners (e.g., rivets), which form a rotational axis of the pawls 103, 104.

Figure 4:
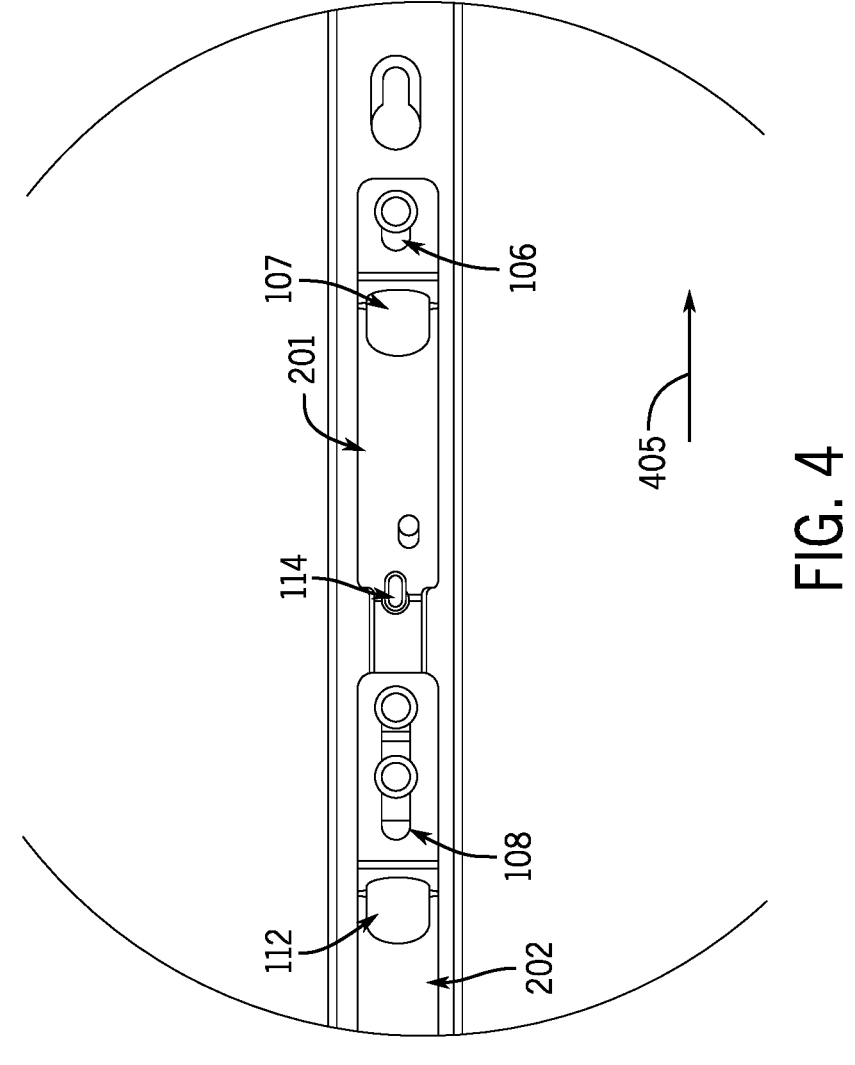
FIG. 4 is a partial side view of the slide rail of FIG. 1 including a first pull rod and a second pull rod of the slide latch assembly of FIG. 3.

In one example, as shown in FIG. 4 in particular, the first pull rod 201 includes a first slot 106 configured to receive a fastener (e.g., a rivet) to slidably secure the first pull rod 201 to the first rail 100. The first pull rod 201 may further include a first handle 107 to permit a user to actuate the first pull rod 201 along a longitudinal direction (shown by arrow 405). The second pull rod 202 includes one or more second slots 109, 110, 111 configured to receive a fastener (e.g., rivet) to slidably secure the second pull rod 202 to the first rail 100. The second pull rod 202 may further include a second handle 112 to permit a user to actuate the second pull rod 202 along a longitudinal direction (e.g., as shown by arrow 405). In one example, the first slide slot 106 has a length shorter than those of the second slide slots 109, 110, 111 and connection slot 108.

As mentioned previously, the first pull rod 201 and the second pull rod 202 may be connected together via one or more fasteners (e.g., rivets) passing through a connection slot 108. In one example, the first pull rod 201 and the second pull rod 202 are connected together such that actuation of the first pull rod 201 (e.g., via the first handle 107) actuates both the first pull rod 201 and the second pull rod 202 together (e.g., effectively as a unitary component). However, due to the differences in permitted travel distance of the fasteners (e.g., rivets) along the slots 106, 108 (e.g., corresponding to the difference in length of the slots 106, 108, etc.), actuation of the second pull rod 202 directly (e.g., via the second handle 112) actuates only the second pull rod 202 and does not actuate the first pull rod 201.

In one example, a biasing element 113 (e.g., a spring or other elastic material) is provided between the second pull rod 202 and the first rail 100. The biasing element 113 may be connected to the second pull rod 202 at one end (e.g., via a snap-fit connection) and connected at a second, opposite, end to the first rail 100 (e.g., via a snap-fit connection).

Figure 3:
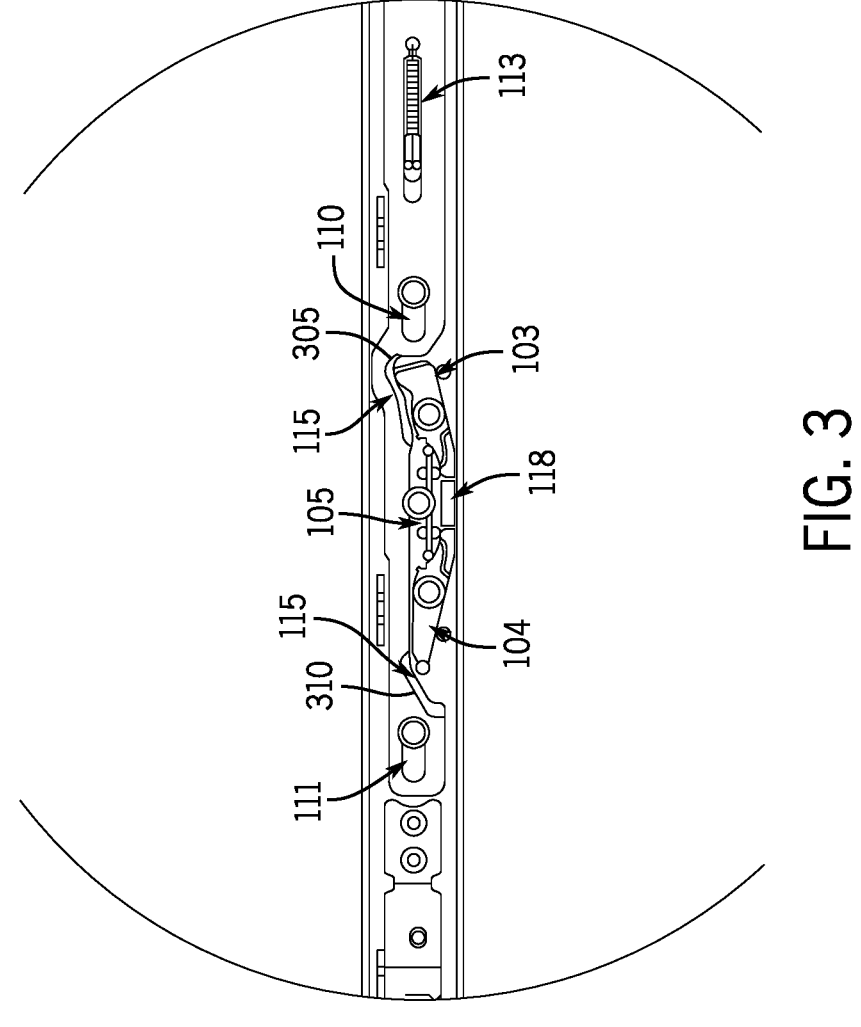
FIG. 3 is a partial side view of the slide rail of FIG. 1 including components of a slide latch assembly according to examples of the present invention.
Figure 5:
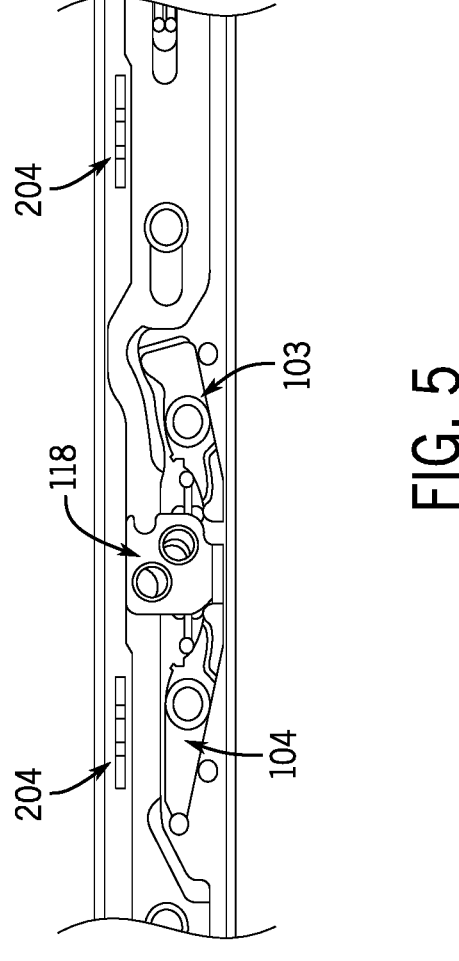
FIG. 5 is another partial side view of the slide rail of FIG. 1 including components of the slide latch assembly.
Figure 6:
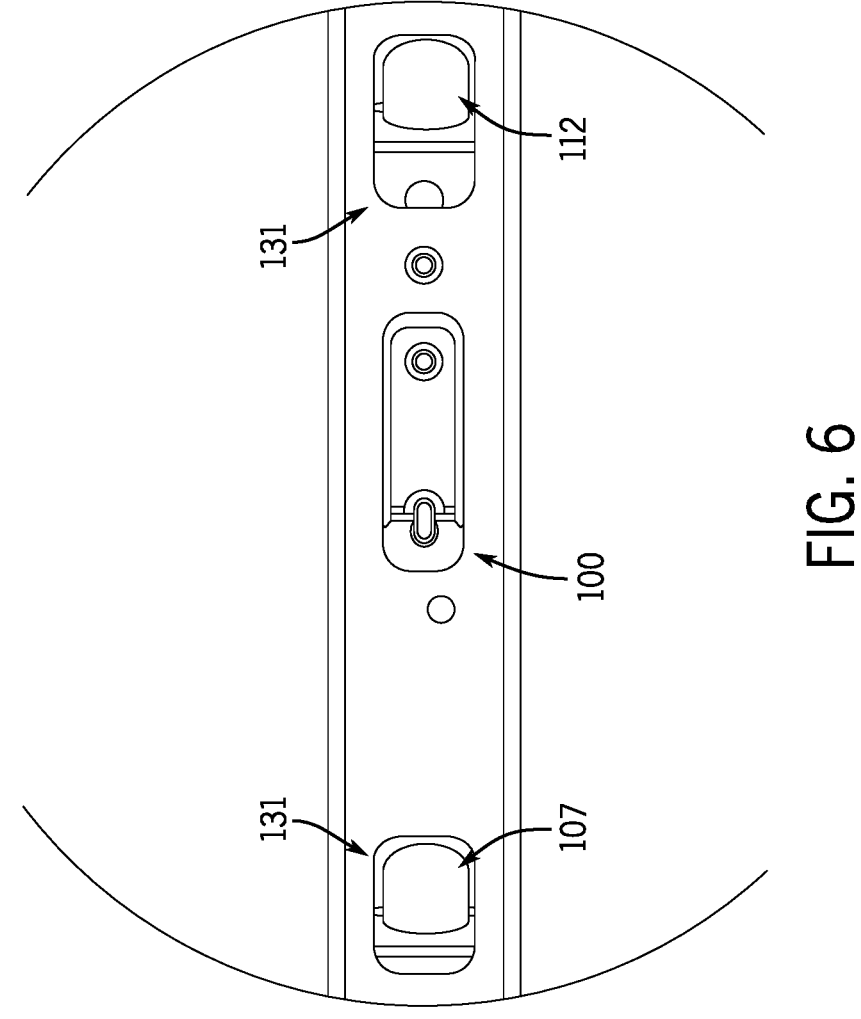
FIG. 6 is a partial side view of the slide rail of FIG. 1 including a first handle and a second handle.

In one example, as shown in FIGS. 3 and 5 in particular, the second pull rod 202 includes arcuate sidewalls 115 configured to engage the first locking pawl 103 or the second locking pawl 104 to elicit rotation in the first or second locking pawls 103, 104. For example, the arcuate sidewalls 115 may engage the first or second locking pawls 103, 104 during actuation (e.g., longitudinal movement) of the first or second pull rods 201, 202 via the first or second handles 107, 112. In one example, the second pull rod 202 may include a first actuate portion 305 corresponding with the first locking pawl 103. The first arcuate portion 305 may elicit a predetermined amount of rotation in the first locking pawl 103 based on a predetermined amount of longitudinal movement of the second pull rod 202 via the second handle 112. Correspondingly, the second pull rod 202 may include a second arcuate portion 310 corresponding with the second locking pawl 103. The second arcuate portion 310 may elicit a predetermined amount of rotation in the second locking pawl 104 based on a predetermined amount of longitudinal movement of the second pull rod 202 via the first pull rod 201 (e.g., using the first handle 107). Although particular arcuate contours are shown in FIGS. 3 and 5, other implementations can include a wide variety of other geometries that are arranged to similarly rotate locking pawls between locked and unlocked orientations.

In one example, the locking block 118 may nest between the first locking pawl 103 and the second locking pawl 104 when the slide rail assembly 95 is opened (e.g., first rail 100 extends out of second rail 90). Correspondingly, the locking block 118 may be positioned at the end portion (e.g., forward and/or front end portion) of the first rail 100 when the slide rail assembly 95 is closed (e.g., first rail 100 contracted into second rail 90).

In one example, as shown in FIG. 1 in particular, the slide rail assembly 95 may include a slide stop assembly having a tongue 116 extending away from the first rail 100 towards the second rail 90. Correspondingly, the second rail 90 may include a groove 117 configured to selectively retain the tongue 116 when the first rail 100 is contracted into the second rail 90 (e.g., when the slide rail assembly 95 is closed). In one example, a plurality of guide tabs 204 extend away from the inside surface of the first rail 100 towards the second rail 90. In one example, the guide tabs 204 are configured to maintain alignment of the second pull rod 202 during actuation of the second pull rod 202.

In one example, the first pull rod 201 may include a protrusion 114 configured to contact an end of the second pull rod 202 during actuation of the second pull rod 202 via the second handle 112. In one example, the first rail 100 includes one or more elongated openings 131 corresponding to the position of the first handle 107 and the second handle 112. The elongated openings 131 may permit a user to access the first handle 107 or the second handle 112 to actuate the first or second pull rods 201, 202.

In one example, when the slide rail assembly 95 is opened, the first rail 100 is telescoped partially out of (e.g., away from) the second rail 90. Due to the outward pulling force, the first rail 100 moves outwards from the second rail 90 via the ball bearing retaining rack 130. Correspondingly, the ball bearing retaining rack 130 moves in concert with the first rail 100. In one example, an end of the ball bearing retaining rack 130 contacts a position-limiting portion of the second rail 90, which prevents further movement of the ball bearing retaining rack 130.

In one example, as the first rail 100 moves outwards, the first locking pawl 103 and the second locking pawl 104 of the slide latch assembly 200 also move outwards. When the locking block 118 in the second rail 90 contacts the first locking pawl 103, the first locking pawl 103 rotates upwards, which permits the locking block 118 to enter a locked area formed by the first locking pawl 103 and the second locking pawl 104.

When the slide rail assembly 95 needs to be closed, the first handle 107 on the first pull rod 201 of the slide latch assembly 200 is pulled. As a result, the first pull rod 201 actuates a distance equal to a maximum length of the first slide slot 106. At this time, due to the movement of the first pull rod 201, the second pull rod 202 moves a corresponding amount. As mentioned previously, the length of the first slide slot 106 is shorter than those of the second slide slots 109, 110, 111. Thus, as the second pull rod 202 moves, only the first locking pawl 103 is driven to rotate upwards via the first arcuate portion 305 of the second pull rod 202. At this time, due to the opening of the first locking pawl 103, the locking block 118 can move without contacting the first locking pawl 103. Thus, when a user pulls the first handle 107, the first rail 100 is able to move only in a single direction (e.g., unidirectionally). When the tongue 116 of the first rail 100 engages the groove 117 of the second rail 90, the first rail 100 has reached a maximum distance of movement, thereby completing closing of the slide rail assembly 95.

When the first rail 100 needs to be removed, the first rail 100 is pulled to be in the open position, at which time the locking block 118 is located between the first locking pawl 103 and the second locking pawl 104. Following this, the second handle 112 is pulled, which actuates the second pull rod 202, but does not actuate the first pull rod 201. Thus, due to the longer second slots 109, 110, 111 of the second pull rod 202 (or, more generally, the differences in permitted travel distance of the corresponding fasteners), the second pull rod is able to actuate a greater distance. Thus, while the second pull rod 202 is moving, the arcuate portions 305, 310 of the second pull rod 202 rotate both the first locking pawl 103 and the second locking pawl 104. When the second pull rod 202 contacts protrusion 114 on the first pull rod 201, the second pull rod 202 is at a maximum actuation distance, at which time removal can be completed by pulling the first rail 100 out of the second rail 90.

Correspondingly, as actuation of the second pull rod 202 via the second handle 112 rotates both the first and second locking pawls 103, 104, the first rail 100 may also be pushed in (e.g., contracted) to complete closing of the slide rail assembly 95. Thus, bidirectional movement of the first rail 100 is permitted when the second pull rod 202 is actuated via the second handle 112.

In some implementations, devices or systems disclosed herein can be utilized, manufactured, or installed using methods embodying aspects of the invention. Correspondingly, any description herein of particular features, capabilities, or intended purposes of a device or system is generally intended to include disclosure of a method of using such devices for the intended purposes, a method of otherwise implementing such capabilities, a method of manufacturing relevant components of such a device or system (or the device or system as a whole), and a method of installing disclosed (or otherwise known) components to support such purposes or capabilities. Similarly, unless otherwise indicated or limited, discussion herein of any method of manufacturing or using for a particular device or system, including installing the device or system, is intended to inherently include disclosure, as embodiments of the invention, of the utilized features and implemented capabilities of such device or system.

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "either," "one of," "only one of," or "exactly one of" For example, a list of "one of A, B, or C" indicates options of: A, but not B and C; B, but not A and C; and C, but not A and B. A list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of A, one or more of B, and one or more of C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C.

As used herein, unless otherwise defined or limited, directional terms are used for convenience of reference for discussion of particular figures or examples. For example, references to downward (or other) directions or top (or other) positions may be used to discuss aspects of a particular example or figure, but do not necessarily require similar orientation or geometry in all installations or configurations.

Also as used herein, unless otherwise limited or defined, "substantially parallel" indicates a direction that is within ±12 degrees of a reference direction (e.g., within ±6 degrees), inclusive. For a path that is not linear, the path can be considered to be substantially parallel to a reference direction if a straight line between end-points of the path is substantially parallel to the reference direction or a mean derivative of the path within a common reference frame as the reference direction is substantially parallel to the reference direction.

Also as used herein, unless otherwise limited or defined, "substantially perpendicular" indicates a direction that is within ±12 degrees of perpendicular a reference direction (e.g., within ±6 degrees), inclusive. For a path that is not linear, the path can be considered to be substantially perpendicular to a reference direction if a straight line between end-points of the path is substantially perpendicular to the reference direction or a mean derivative of the path within a common reference frame as the reference direction is substantially perpendicular to the reference direction.

Also as used herein, unless otherwise limited or defined, "integral" and derivatives thereof (e.g., "integrally") describe elements that are manufactured as a single piece without fasteners, adhesive, or the like to secure separate components together. For example, an element stamped, cast, or otherwise molded as a single-piece component from a single piece of sheet metal or using a single mold, without rivets, screws, or adhesive to hold separately formed pieces together is an integral (and integrally formed) element. In contrast, an element formed from multiple pieces that are separately formed initially then later connected together, is not an integral (or integrally formed) element.

Additionally, unless otherwise specified or limited, the terms "about" and "approximately," as used herein with respect to a reference value, refer to variations from the reference value of ±15% or less, inclusive of the endpoints of the range. Similarly, the term "substantially equal" (and the like) as used herein with respect to a reference value refers to variations from the reference value of less than ±30%, inclusive. Where specified, "substantially" can indicate in particular a variation in one numerical direction relative to a reference value. For example, "substantially less" than a reference value (and the like) indicates a value that is reduced from the reference value by 30% or more, and "substantially more" than a reference value (and the like) indicates a value that is increased from the reference value by 30% or more.

Also as used herein, unless otherwise limited or specified, "substantially identical" refers to two or more components or systems that are manufactured or used according to the same process and specification, with variation between the components or systems that are within the limitations of acceptable tolerances for the relevant process and specification. For example, two components can be considered to be substantially identical if the components are manufactured according to the same standardized manufacturing steps, with the same materials, and within the same acceptable dimensional tolerances (e.g., as specified for a particular process or product).

The previous description of the disclosed embodiments is provided to enable any person skilled in the art to make or use the invention. Given the benefit of this disclosure, various modifications to these embodiments will be readily apparent to those skilled in the art, and the principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A server slide, comprising:
a first rail;
a second rail that slidably receives the first rail;
a first pull rod defining a first slot having a first length, the first pull rod slidably mounted to the first rail via a fastener arranged through the first slot; and
a second pull rod defining a second slot having a second length, the second pull rod slidably mounted to the first rail via a fastener arranged through the second slot;
a first locking pawl rotatably supported on the first rail to engage a locking block extending from the second rail; and
a second locking pawl rotatable supported on the first rail to engage a locking block extending from the second rail;
wherein the second length of the second slot of the second pull rod is greater than the first length of the first slot of the first pull rod; and
wherein the first and second pull rods are mechanically connected such that actuation of the first pull rod simultaneously actuates the second pull rod.

2. The server slide of claim 1, wherein the first and second pull rods are connected via a fastener arranged through a connection slot defined by the second pull rod.

3. The server slide of claim 1, wherein the second pull rod includes a first arcuate surface configured to selectively contact the first locking pawl during actuation of the second pull rod via a first handle of the first pull rod.

4. The server slide of claim 3, wherein the second pull rod includes a second arcuate surface configured to selectively contact the second locking pawl during actuation of the second pull rod via a second handle of the second pull rod.

5. The server slide of claim 3, wherein actuation of the first pull rod rotates the first locking pawl to permit unidirectional movement of the first rail relative to the second rail.

6. The server slide of claim 5, wherein actuation of the second pull rod rotates both the first and second locking pawls to permit bidirectional movement of the first rail relative to the second rail.

7. The server slide of claim 1, further comprising:
a biasing element arranged between the second pull rod and the first rail;
wherein the biasing element is configured to bias the second pull rod into a locked position; and
wherein, with the second pull rod in the locked position, relative movement of the first rail with respect to the second rail is restricted.

8. A server slide, comprising:
a first rail;
a second rail that slidably receives the first rail;
a first pull rod, the first pull rod slidably mounted to the first rail;
a second pull rod, the second pull rod slidably mounted to the first rail;
a first locking pawl rotatably supported on the first rail to engage a locking block extending from the second rail; and
a second locking pawl rotatably supported on the first rail to engage a locking block extending from the second rail;
wherein the first and second pull rods are mechanically connected such that actuation of the first pull rod simultaneously actuates the second pull rod;
wherein actuation of the first pull rod causes the second pull rod to rotate the first locking pawl to permit unidirectional movement of the first rail relative to the second rail; and
wherein actuation of the second pull rod causes the second pull rod to rotate both the first and second locking pawls to permit bidirectional movement of the first rail relative to the second rail.

9. The server slide of claim 8, wherein the first pull rod is slidably mounted to the first rail via a first fastener arranged through a first slot, and wherein the first slot defines a first length.

10. The server slide of claim 9, wherein the second pull rod is slidably mounted to the first rail via a second fastener arranged through a second slot that defines a second length.

11. The server slide of claim 10, wherein the first length of the first slot permits a first distance of travel of the first rail relative to the first fastener, the second length of the second slot permits a second distance of travel of the second rail relative to the second fastener, and the second distance of travel is greater than the first distance of travel.

12. The server slide of claim 8, wherein the first and second pull rods are connected via a fastener arranged through a connection slot defined by the second pull rod.

13. The server slide of claim 8, wherein the second pull rod includes a first engagement surface configured to selectively contact the first locking pawl, during actuation of the second pull rod via engagement of the first pull rod.

14. The server slide of claim 13, wherein the second pull rod includes a second engagement surface configured to selectively contact the second locking pawl during actuation of the second pull rod.

15. The server slide of claim 8, further comprising:

a first handle formed in the first pull rod; and a second handle formed in the second pull rod;

wherein the first handle is configured to actuate the second pull rod via the first pull rod; and wherein the second handle is configured to actuate only the second pull rod.

16. A method of actuating a server slide, comprising:

actuating, via a first handle of a first pull rod, a first pull rod secured to a first rail and a second pull rod secured to a first rail, to rotate a first locking pawl of the server slide via contact with a first engagement portion of the second pull rod and thereby permit slidable movement of the first rail relative to a second rail in a first direction; and actuating the second pull rod via a second handle of the second pull rod to rotate the first locking pawl via contact with the first engagement portions of the second pull rod and rotate a second locking pawl via contact with a second engagement portion of the second pull rod and thereby permit slidable movement of the first rail in both a first direction and a second, opposite, direction.

17. The method of claim 16, wherein the first pull rod slidably actuated along the first rail as guided by a first fastener arranged through a first slot.

18. The method of claim 17, wherein the second pull rod is slidably actuated along the first rail as guided by a second fastener arranged through a second slot.

19. The method of claim 18, wherein a first length of the first slot along the first pull rod is smaller than a second length of the second slot along the second pull rod.

\* \* \* \* \*